United States Patent
Yalamanchili et al.

(10) Patent No.: US 10,325,036 B2
(45) Date of Patent: Jun. 18, 2019

(54) METHOD AND SYSTEM FOR DETERMING WELDING PROCESS PARAMETERS

(71) Applicant: Caterpillar Inc., Peoria, IL (US)

(72) Inventors: Vijay K. Yalamanchili, Savoy, IL (US); Justin C. Mach, Dunlap, IL (US); Joshua D. Webb, Tracy, CA (US); Julian Norato, South Windsor, CT (US); Badrinarayan P. Athreya, The Woodlands, TX (US)

(73) Assignee: Caterpillar Inc., Deerfield, IL (US)

( * ) Notice: Subject to any disclaimer, the term of this patent is extended or adjusted under 35 U.S.C. 154(b) by 415 days.

(21) Appl. No.: 15/062,315

(22) Filed: Mar. 7, 2016

(65) Prior Publication Data

US 2017/0255718 A1    Sep. 7, 2017

(51) Int. Cl.
*B23K 31/02* (2006.01)
*B23K 31/12* (2006.01)
*G06F 17/50* (2006.01)

(52) U.S. Cl.
CPC .......... *G06F 17/5009* (2013.01); *B23K 31/02* (2013.01); *B23K 31/12* (2013.01)

(58) Field of Classification Search
None
See application file for complete search history.

(56) References Cited

U.S. PATENT DOCUMENTS

| | | | |
|---|---|---|---|
| 6,583,386 B1 | 6/2003 | Ivkovich | |
| 7,991,593 B2 | 8/2011 | Olsen et al. | |
| 8,692,157 B2 | 4/2014 | Daniel et al. | |
| 9,067,274 B2 | 6/2015 | Hideg | |
| 9,102,012 B2 | 8/2015 | Norato et al. | |
| 9,104,195 B2 | 8/2015 | Daniel et al. | |
| 2007/0043622 A1* | 2/2007 | Olsen | C40B 50/02 705/22 |
| 2012/0325782 A1* | 12/2012 | Norato | B23K 31/02 219/117.1 |

OTHER PUBLICATIONS

Liao, Y. G. (2005). Optimal design of weld pattern in sheet metal assembly based on a genetic algorithm. The International Journal of Advanced Manufacturing Technology, 26(5-6), 512-516. (Year: 2005).*

(Continued)

*Primary Examiner* — Omar F Fernandez Rivas
*Assistant Examiner* — Bijan Mapar
(74) *Attorney, Agent, or Firm* — Harrity & Harrity LLP

(57) ABSTRACT

A method for determining a welding sequence including a plurality of welding operations is disclosed. The method includes steps of determining a population of welding sequences based on a set of user-generated constraints, and simulating welding for at least one welding sequence in the population of welding sequences to obtain a multi-objective dependent distortion model of the at least one welding sequence. The method further includes steps of comparing a merit value of the multi-objective dependent distortion model for the at least one welding sequence with one or more predetermined criteria, and outputting a set of welding sequences as potential welding sequences based on the comparison between the merit value and the multi-objective dependent distortion model.

20 Claims, 9 Drawing Sheets

(56) References Cited

OTHER PUBLICATIONS

Dang, X. P. (2014). General frameworks for optimization of plastic injection molding process parameters. Simulation Modelling Practice and Theory, 41, 15-27. (Year: 2014).*

L. Shelley Xie, Ching Hsieh, Clamping and Welding Sequence Optimisation for Minimising Cycle Time and Assembly Deformation, International Journal of Materials and Product Technology,2002,vol. 17, Nos. 5/6, USA.

* cited by examiner

METHOD AND SYSTEM FOR DETERMINING WELDING PROCESS PARAMETERS

TECHNICAL FIELD

The present disclosure relates generally to welding methods, and more particularly, to a method and a system for determining welding process parameters.

BACKGROUND

Welding operations are required in a variety of manufacturing applications, e.g., while fabricating components of a mechanical structure or while joining existing components. The welding operations, however, cause various undesirable side effects on the welded components. For example, distortions may build up from the intense heat being involved in the welding operations. Therefore, the resultant component may not maintain the desired shape when welding is completed. Although distortion of components can be sometimes resolved by operations, such as straightening operations and top level machining, these operations are limited to resolve simple distortions like flatness. But for large complex components, the restoration of deformed size to original size and specification may become difficult. Further, the distortion of components may also have a negative effect on the performance or functioning of the component.

SUMMARY OF THE DISCLOSURE

In one aspect of the present disclosure, a computer implemented method for determining a welding sequence of welding operations is provided. The method includes determining a population of welding sequences based on a set of user-generated constraints. The method further includes simulating welding for at least one welding sequence in the population of welding sequences to obtain a multi-objective dependent distortion model of the at least one welding sequence. The method further includes comparing merit value of the multi-objective dependent distortion model for the at least one welding sequence with one or more predetermined criteria. The method further includes outputting a set of welding sequences as potential welding sequences based on the comparison between the merit value and the multi objective dependent distortion model.

In another aspect, the present disclosure is directed to a system for determining a welding sequence including a plurality of welding operations. The system may include a welding sequence generator configured to create a population of welding sequences based on at least one user-generated constraint. The system may also include a welding simulator configured to simulate welding for at least one welding sequence in the population to obtain multi objective distortion model for the at least one welding sequence. The welding sequence generator may be further configured to receive the distortion for the at least one welding sequence in the initial population from the welding simulator. The welding sequence generator may determine whether a merit value derived from at least the distortion for the at least one welding sequence satisfies one or more predetermined criteria. Further, the welding sequence generator may output the at least one welding sequence as a potential welding sequence if the merit value satisfies the predetermined criteria.

In yet another aspect, the present disclosure is directed to a computer-readable storage device storing instructions for determining a welding sequence including a plurality of welding operations. The instructions may cause one or more computer processors to create a population of welding sequences based on at least one user-generated constraint, and to receive a distortion estimate for at least one welding sequence in the initial population of welding sequences. The instructions may further cause one or more computer processors to determine whether a merit value derived from at least the distortion estimate for the at least one welding sequence satisfies one or more predetermined criteria, and to output the at least one welding sequence as a potential welding sequence if the merit value satisfies the predetermined criteria.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts.

Figure 1:
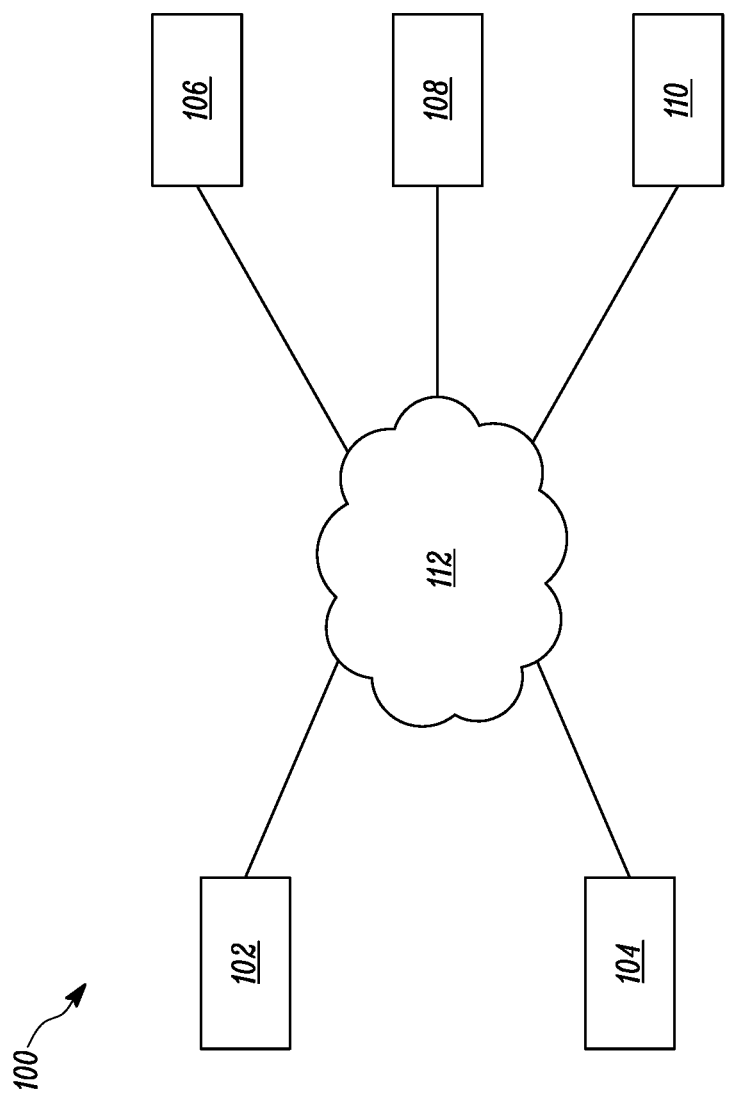
FIG. 1 is a schematic illustration of an exemplary disclosed system for determining welding sequences.

FIG. 1 is a schematic block diagram of a system 100 for determining process parameters for one or more welding sequences in which welding operations may be performed on a welding assembly. The system 100 includes a welding sequence generator 102, a controller 104, and a plurality of welding simulators, such as a simulator 106, a simulator 108, and a simulator 110. The welding sequence generator 102, the controller 104, and the plurality of welding simulators, such as the simulator 106, the simulator 108, and the simulator 110 may be connected by a network 112.

Figure 2:
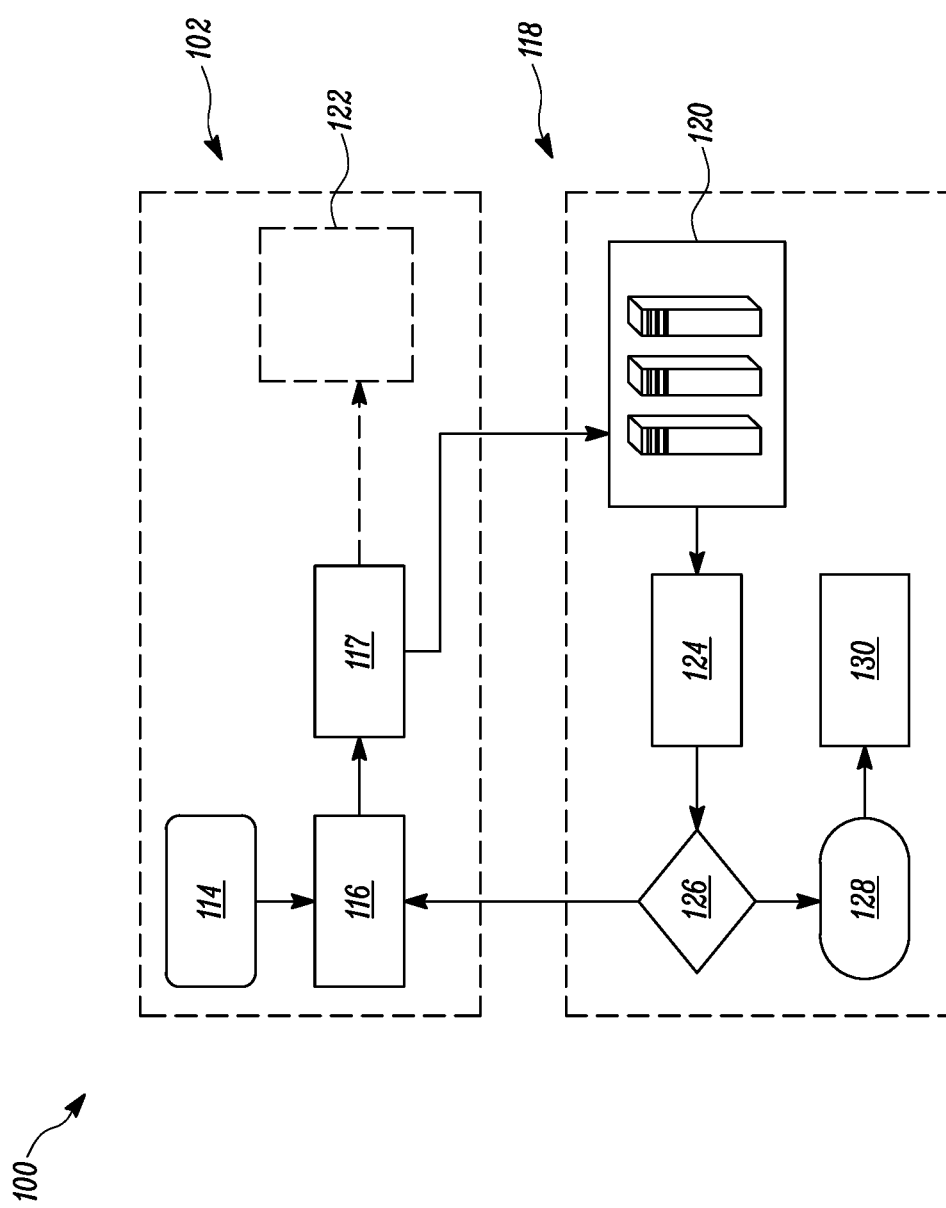
FIG. 2 is a flow chart illustrating an exemplary disclosed system for determining welding sequences of FIG. 1.

Referring now to FIG. 2, which illustrates a flow chart of the system of FIG. 1, wherein the welding sequence generator 102 may include one or more input and output devices 114. The one or more input and output devices 114 enable the welding sequence generator 102 to communicate with other devices and/or operators, via the network 112 (not illustrated in FIG. 2). Through the one or more input and output devices 114, in certain embodiments, the welding sequence generator 102 may receive one or more user-generated constraints for generating populations of welding sequences. The user-generated constraints are used to generate an initial population and subsequent populations of welding sequences such that the initial population and the subsequent populations of welding sequences satisfy the user-generated constraints.

Figure 3:
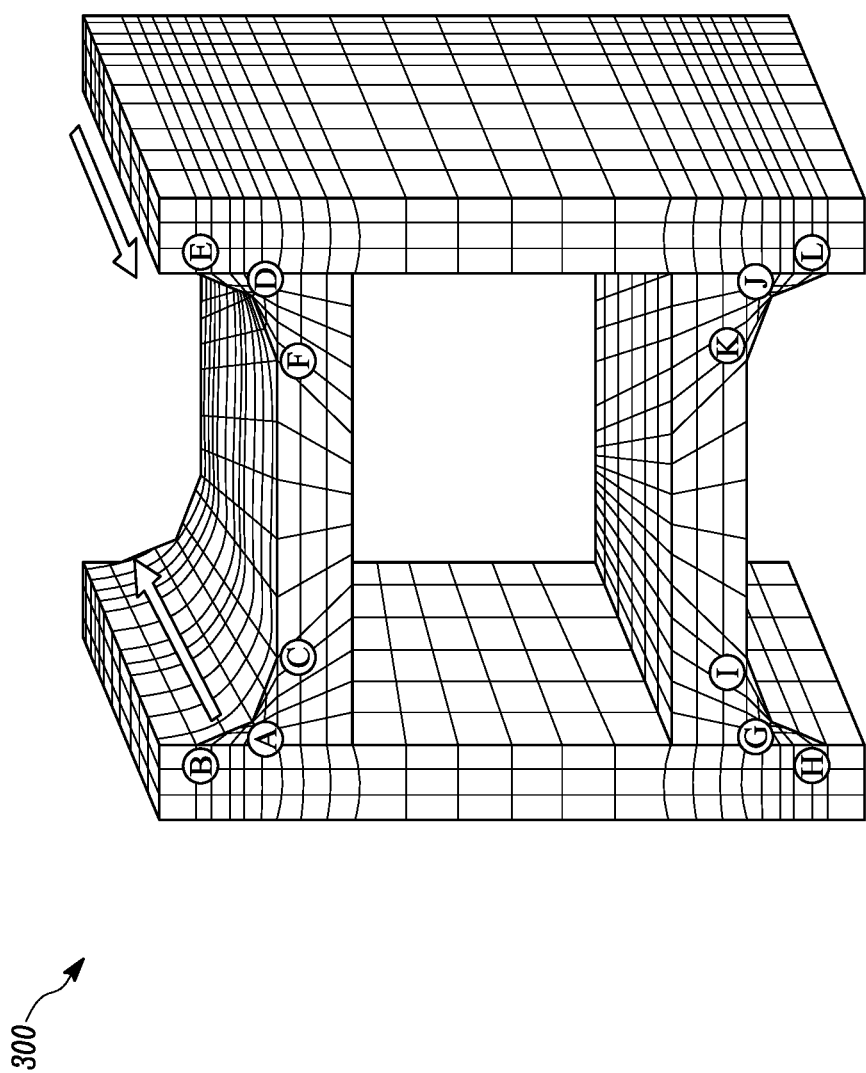
FIG. 3 is a perspective view of a welding assembly on which welding operations are to be performed.
Figure 4:
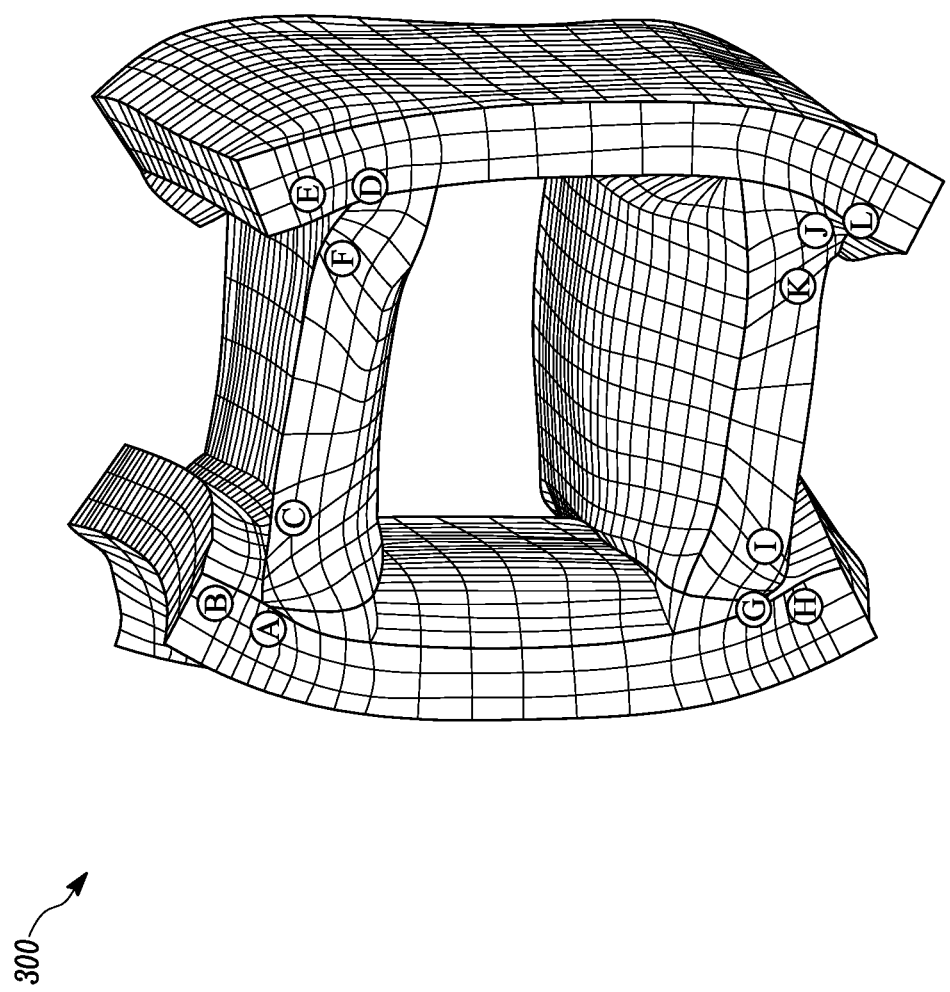
FIG. 4 is a perspective view of the welding assembly showing distortion due to the welding operations.

In one embodiment, the user-generated constraints may also include one or more inputs pertaining to a component, such as a component 300, shown in FIG. 3 and FIG. 4. For example, the user-generated constraints may include a simulation model, e.g., a Virtual Fabrication Technology (VFT™) model, of the component to be welded. In an embodiment, the simulation model may be a computer generated finite element model of the component 300 to be welded, as shown in FIG. 3. The user-generated constraints may also include inputs on a number of individual welds, e.g., 12 (A, B, C, D, E, F, G, H, I, J, K and L) in the component 300, and inputs on optimization objectives and parameters, for example, an input on the number of generations and a number of individuals per generation.

The user-generated constraints discussed here are merely examples and any type of user-generated constraint may be used to create the initial population and/or the subsequent populations of welding sequences. For example, other user-generated constraints may include requiring a particular welding sequence to be performed first, requiring a particular welding sequence to be performed last, designating maximum number of welding assembly repositions, etc. In an embodiment, the welding sequence generator 102 may receive a user-generated weld direction constraint that indicates a direction in which an assembly (e.g. the component 300) is to be welded. For example, some welding operations may be performed in a forward direction (indicated in FIGS. 3 and 4) and some welding operations may be performed in a reverse direction (indicated in FIGS. 3 and 4). Because the direction in which welding performed during the welding operation may take additional time to finish the welding operations, it may have additional distortion effects. In addition to the time to finish, weld directions may have further effects, for example the thermo-mechanical interaction with the structure itself, due to the transient nature of the welding process, i.e. the beginning of the weld is not the same as the end of the weld due to the transient heating/cooling that occurs along the weld length. Switching weld direction may cause a weld to have more thermo-mechanical interaction with another weld depending on their spatial relation. If the welding sequence generator 102 receives a user-generated weld direction constraint restricting the direction of weld in a welding operation, then the welding sequence generator 102 may limit the population to only welding sequences that follow certain direction constraints.

A multi-objective algorithm that may also be stored in a storage 120. In an embodiment, the welding sequence generator 102 may also include an input for receiving user-generated multi-objective functions for the multi-objective algorithm that may be stored in the storage 120. The multi-objective algorithm may include one or more objective functions against which one or more of the welding sequences in each population are measured. The objective functions may include variables related to the effects that the welding sequences may have on the assembly, e.g., distortion, cycle time, cooling time, etc. Exemplary objective functions may include a maximum mechanical distortion of the assembly across all points, a total cycle time, a cooling time dependent welding sequences, etc. Exemplary objective functions may also take into account effects other than distortion. As illustrated in FIG. 2, the welding sequence generator 102 may include a Multi-objective Combinatorial Genetic Algorithm Optimizer 116.

Based on the population of possible welding sequences generated by the welding sequence generator 102, and the Multi-objective Combinatorial GA Optimizer 116, the controller 104 generates input files (at illustrated block 117) of each possible welding sequence in the population and may send the input files to one or more of the welding simulators 106, 108,110 (collectively referred to as "simulator 118") via the network 112. In an example, the input files may contain individual generations, such as "Sequence 2-3-1-7-6-5-4, Cooling levels 1,3,4,4,2,1 and Weld directions F,R,F,F,R,R, F" or Sequence 1-7-2-4-6-3-5, Cooling levels 2,1,1,3,2,4 and Weld directions F,F,R,F,F,R,F. The welding simulators 106, 108,110 may use the input files to simulate welding and determine one or more effects of each welding sequence.

The welding sequence generator 102 may include any type of sequence generator which generates welding sequences based on the multi-objective functions. For example, a high performing computing device or a computer or any device may include the welding sequence generator 102. To generate a population of the possible welding sequences 122, the welding sequence generator 102 requires a processing unit for executing the programs, a memory unit (not shown) loaded with the programs which are to be executed by the processor, and a storage unit (not shown) for storing information and data for processing of various components of the system 100. For example, the storage unit may include data relating to the welding effects of the welding sequences. Based on this data and multi objective genetic algorithm, the welding sequence generator 102 may generate the population of possible welding sequences 122.

In order to process the data, the welding sequence generator 102 communicates with other components of the system 100. Various input/output devices are provided in the welding sequence generator 102 to communicate with other components of the system 100.

Therefore, the welding sequence generator 102 generates the population of possible welding sequences 122 based on the set of user-generated constraints. Thereafter, the plurality of welding simulators 106, 108,110 (collectively referred to as simulators 118) simulates welding for at least one welding sequence in the population of welding sequences to obtain a multi-objective dependent distortion model of the at least one welding sequence.

Figure 8:
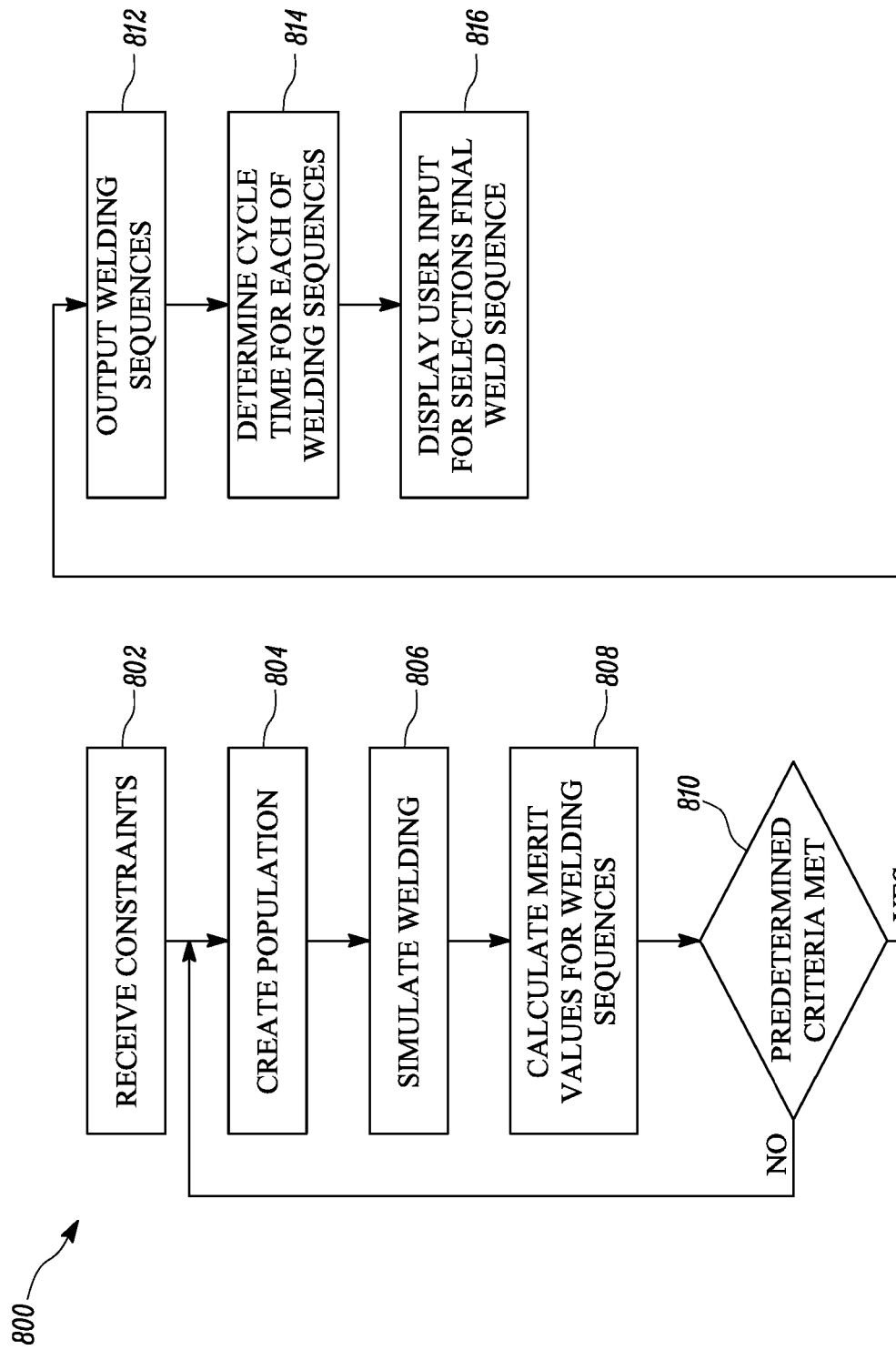
FIG. 8 is a flow chart illustrating an exemplary method of operating the system.

The simulators 118 of the system 100 may compile the objectives at block 124. Specifically, the simulators 118 of the system 100 may simulate welding for the at least one welding sequence in the population of welding sequences to obtain a multi-objective dependent distortion model of the at least one welding sequence. Further, the simulator 118 of the system 100 may compare a merit value of the multi-objective dependent distortion model for the at least one welding sequence with one or more predetermined criteria. The simulators 118 of the system 100 may, at block 126, determine convergence or if maximum number of generations have been created. If the convergence is not complete or if maximum number of generations have been created, the process stops at block 128. Subsequently, the simulators 118 of the system 100 may, through an output means, outputs potential welding sequences to a user, e.g., by a device, such as a display device at block 130. The controller 104 of the system 100 may measure welding sequences against multi objective functions in order to compile objectives of the welding process. Further, the controller 104 of the system 100 may measure the welding sequences against multi objective functions in order determine a relative merit (e.g. fitness) of each welding sequence by which the relative merit of each of the welding sequence is determined. The welding sequences with highest merit are outputted as potential welding sequences by the system 100, thus, informing the user about the results. This process is further explained in conjunction with FIG. 8, with the help of a schematic block diagram.

Further, a subsequent population is generated by the welding sequence generator 102 by identifying candidates of previous populations making relative merit of objective function of at least one welding sequence of subsequent population greater than or equal to the relative merit of all welding sequences in the previous population. For example, if the objective function represents distortion due to a weld direction, the welding sequence generator 102 may identify candidates from a previous population such that the at least one welding sequence in the subsequent population has weld direction distortion less than or equal to the distortion in all sequences of the previous population.

The process of receiving the welding sequences from the welding sequence generator 102 and generating input files to be send to the welding simulators 118 is handled by the controller 104. The functions, such as the receiving of the welding sequences, the generation, and the sending of input files to the welding simulators 106, 108, 110 are performed by the controller 104, when one or more programs are executed by the processor. These programs are loaded from the storage by the memory. Further, the storage may store workload balancing software that enables the controller 104 to send input files to the welding simulators 118 in a way that balances workloads among them and allows them to process different input files in parallel.

In some embodiments, various computer softwares may enable computer to perform the functions of the welding sequence generator 102 and the controller 104. In other embodiments, the controller 104 may be included in one of the welding simulators 106, 108, 110.

Similar to other components like the welding sequence generator 102 and the controller 104, the welding simulators 106, 108, 110 may also be embodied by a computer or any other device which includes a processor, a memory, and a storage (not shown) or by a single computer with multiple processors. The processor executes the programs included in the memory to enable the welding simulators 106, 108, 110 to perform various procedures, operations or processes consistent with disclosed embodiments, including the processes described with regard to FIG. 1. While only three welding simulators are shown in FIG. 1, any number of the welding simulators may be used.

After completion of the welding simulations, the results of the welding simulation are sent to the controller 104 and/or to the welding sequence generator 102. The results may include, e.g., the sequence of welding operations, the cooling time between welding operations, etc.

Figure 5:
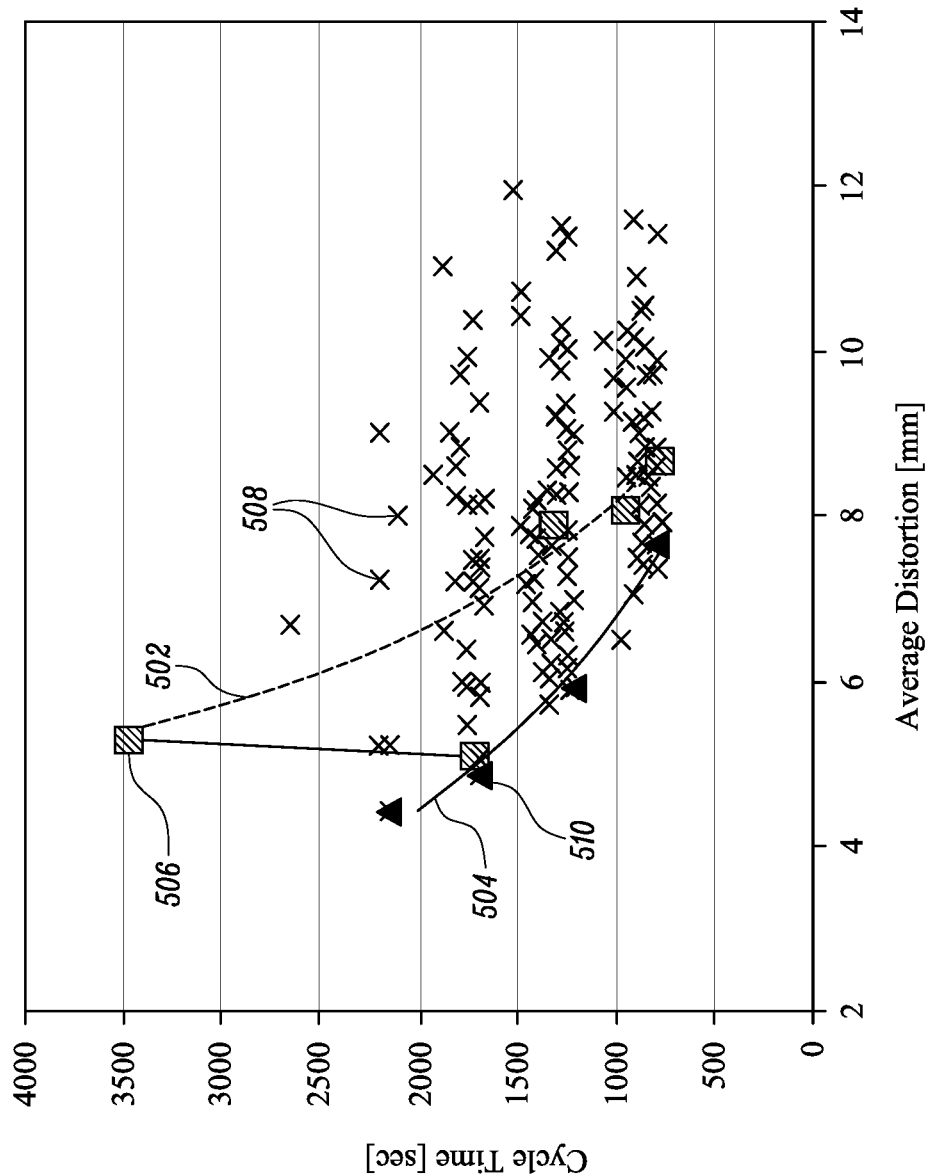
FIG. 5 is a graph showing distortion versus cycle time of welding sequences when a cooling level constraint is applied.

FIG. 5 shows a graph of an average distortion versus a cycle time of the optimized welding sequences, when the system 100 performs process as described above. In the Non-Sorting Genetic Algorithm 2 (NSGA-2), design variables are provided as the user-generated constraints. The design variables include the cooling times between weld operations and the weld directions of the welding operations. While various welding operations are performed on the welding assembly, intense heat builds up at the welding assembly which increases distortion in the welding assembly. Hence, the welding assembly is allowed to cool between the welding operations. Cooling of welding assembly also affects the amount of distortion of the welding sequence. The graph shows effect of the cooling times between the weld operations of the optimized weld sequences generated by the welding sequence generator 102. In the graph, line 502 represents weld sequence optimization of older generation with a fixed cooling time, line 504 represents weld sequence optimization of the system 100, legend 506 represents points for weld sequence optimization of older generation with the fixed cooling time, legend 508 represents all points for weld sequence optimization of the system 100, and legend 510 represents selected points for weld sequence optimization of the system 100. In the graph, the cycle time represents the total time taken to complete a welding sequence, and may be calculated in seconds, and the amount of distortion in the welding assembly may be calculated in MM (Millimeter).

Various optimized sequences generated by the genetic algorithm optimizer of the welding sequence generator 102 are plotted on the graph. For a distortion of 6 mm, the cycle time of the optimized welding sequence generated by the Non-Sorting Genetic Algorithm 2 (NSGA-2) is reduced by 50 percent compared to the cycle time of the optimized welding sequence generated by the Single objective combinatorial genetic algorithm with fixed cooling times. Further, for the same cycle time, the distortion is reduced by 25 percent. All the potential welding sequences which meet the predetermined criteria are together represented as a Pareto Front.

Figure 6:
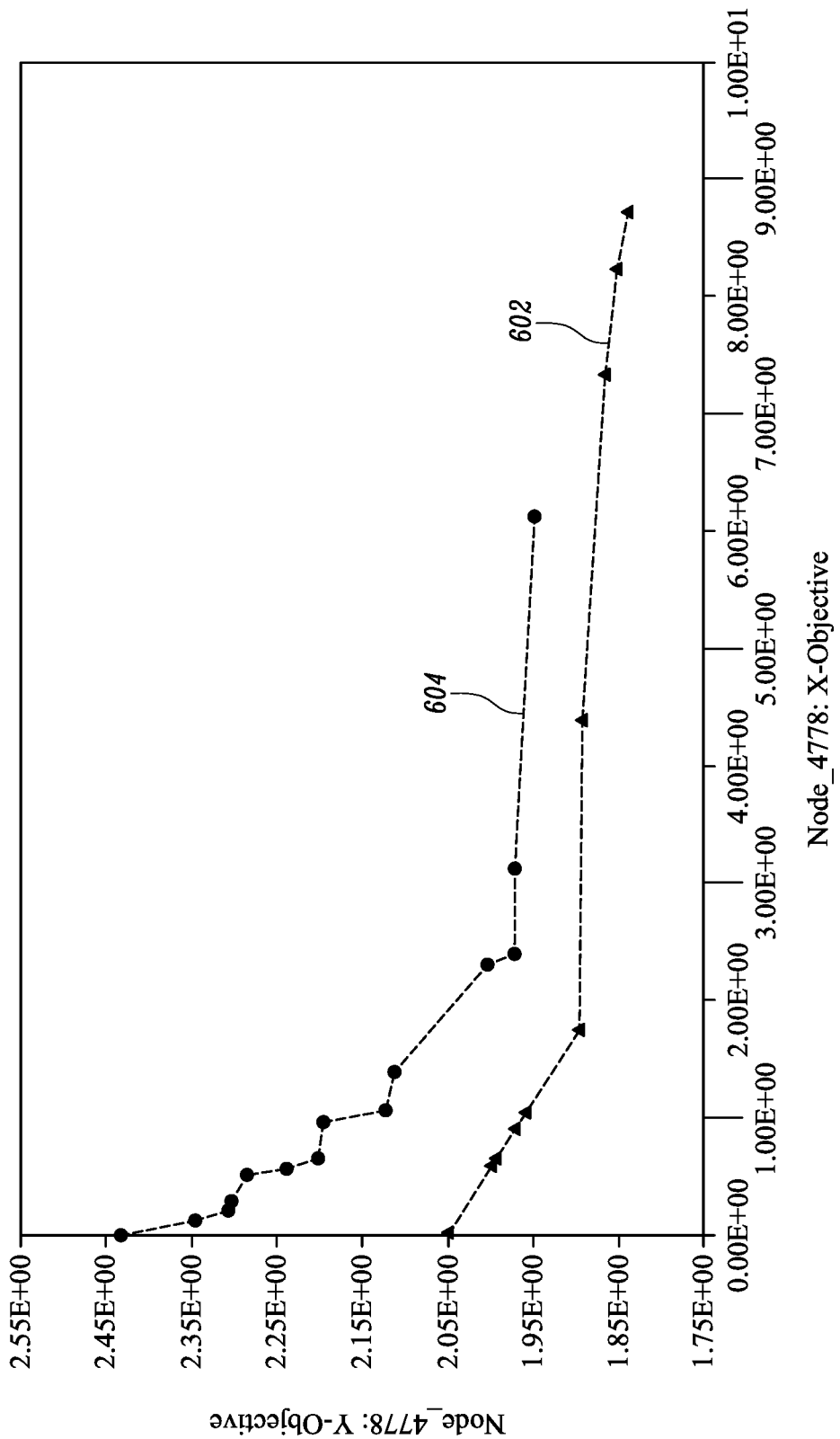
FIG. 6 is a graph comparing distortion in X objective versus Y objective of welding sequences, when a weld direction constraint is applied.

FIG. 6 shows a graph of X objective versus Y objective of optimized welding sequences for the welding assembly, when the system 100 performs process as described in the FIG. 2 of the present disclosure. In FIG. 6, welding sequences which are optimized with design variables, such as a weld direction as a user-generated constraint and welding sequences which are optimized without weld direction as user-generated constraint are plotted. Providing the weld direction as a user-generated constraint also affects the distortion of the welding sequence. For all the distortion in X objective, distortion obtained in the Y objective without the weld direction is high as compared to the distortion obtained in the Y objective with the weld direction. Hence, the optimization of design variables affects the cycle time and the distortion of the welding sequence in the welding assembly.

The entire communication between the welding sequence generator 102, the controller 104, and the welding simulators 106, 108, 110 is possible through the network 112 which may be any one of or combination of wired or wireless networks. Wired networks may include twisted pair wire, coaxial cable, optical fiber, and/or a digital network. Wireless networks may include RFID, microwave or cellular networks. Additionally, the network 112 may be integrated into any local area network, wide area network, campus area network, or the Internet.

Figure 7:
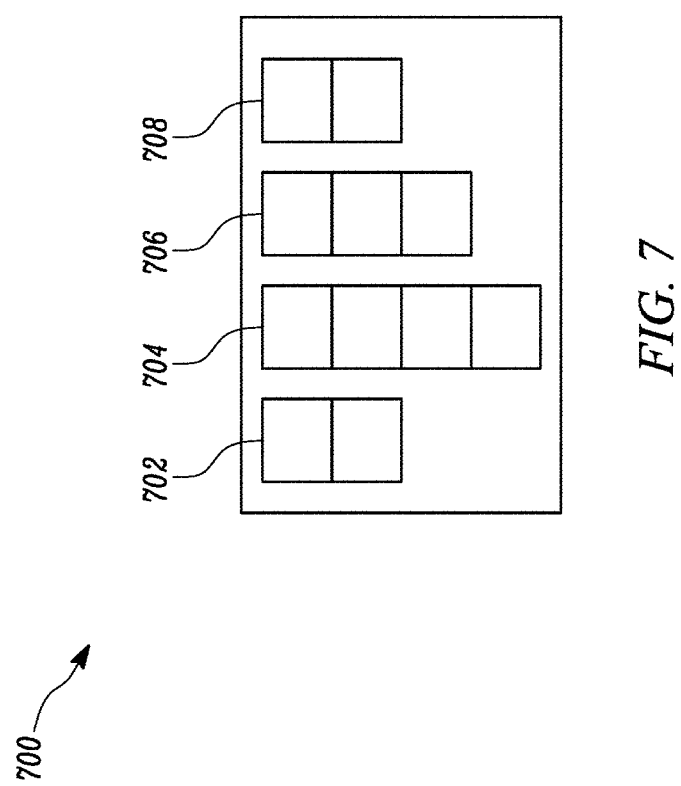
FIG. 7 is a block diagram of an embodiment of the system for determining the welding sequences of FIG. 1.

Referring now to FIG. 7, which illustrates a component 700 having a plurality of sub assemblies 702, 704, 706, and 708. The component 700 may be a structural welded fabrication that requires multiple operations (or steps) where, in between the operations, there may be long periods of cooling time, parts added or removed, and/or changes in fixture (boundary) conditions. Each sub assembly of the plurality of sub assemblies 702 may be welded based on the system 100. Further the sub assemblies may be welded together to form the component 700, again using the system 100. To optimize for multiple operations, a more sophisticated block-based algorithm (where a block of welds represents a single operation) is proposed in the present disclosure, with constrained and flexible welds that can move between blocks (operations) while maintaining changes made between operations, e.g., changes in fixtures.

INDUSTRIAL APPLICABILITY

The disclosed system 100 may be applicable to determining an optimal or acceptable welding sequence for any assembly to be welded. The disclosed system 100 may utilize multiple design variables and optimization parameters for faster determination of the optimal and/or acceptable welding sequence for an assembly. The operation of the system 100 will now be explained in connection with the flowchart of FIG. 8.

The process 800 of obtaining an optimal sequence of welding includes providing various parameters/constraints as input to the system 100, at step 802. Various parameters may include design variables and optimization parameters. For example, the design variables include sequence of welding operations to be performed, cooling times between weld operations, and a direction of the welding in welding operations. Further, the optimization parameters include a number of generations and a number of weld processes evaluated per generation which may be provided as user-generated constraints. The system 100 may thereafter create a population of weld sequences based on the received constraint (at step 804). For example, the system 100 may generate welding sequences such that all of the welding sequences in the population satisfy the received user-generated constraints.

Based on the received constraints, the system 100 may simulate welding for each of the welding sequences in the population (at step 806). As an output of this simulation, a multi-objective dependent distortion model of each the welding sequence may be simulated. By simulation of welding sequences, the welding effects of the welding sequences are obtained. The system 100 may also simulate welding for two or more welding sequences in parallel.

Further, the system 100 may calculate merit values for each of the welding sequences based on data from the welding simulation and multi objective functions used in the genetic algorithm (step 808). The system 100 may compare the merit values of the welding sequences to one or more predetermined criteria (step 310). For example, the system 100 may determine if the values of distortion in a welding sequence, distortion due to the direction of weld, and cooling time between the welds are within a threshold limit of the predetermined criteria. The system 100 evaluates the effect of welding for all the populations of possible welding sequences. The system 100 may also determine whether a maximum number of populations have been generated. If neither the predetermined criteria nor the maximum number of populations have been met (step 810, No), then the system 100 may generate a subsequent population of welding sequences (step 804). The process may then repeat until a predetermined criterion is met or a maximum number of populations are generated (step 810, Yes).

If, on the other hand, the predetermined criteria have been met or a maximum number of populations have been generated, the system 100 may output one or more welding sequences from the current population (step 812). For example, if one or more welding sequences have merit values below a predetermined threshold, the system 100 may output those welding sequences to a user, e.g., via a display device, presenting the welding sequences as potential welding sequences for the assembly. Further, the cycle time pertaining to each of the potential welding sequences is determined (step 814). The cycle time is the time taken to perform the welding sequence for the assembly. Based on the cycle time of the potential welding sequences, a user input to select a final weld sequence is generated (step 816). The final weld sequence is the sequence which results in minimum distortion of the weld assembly.

Figure 9:
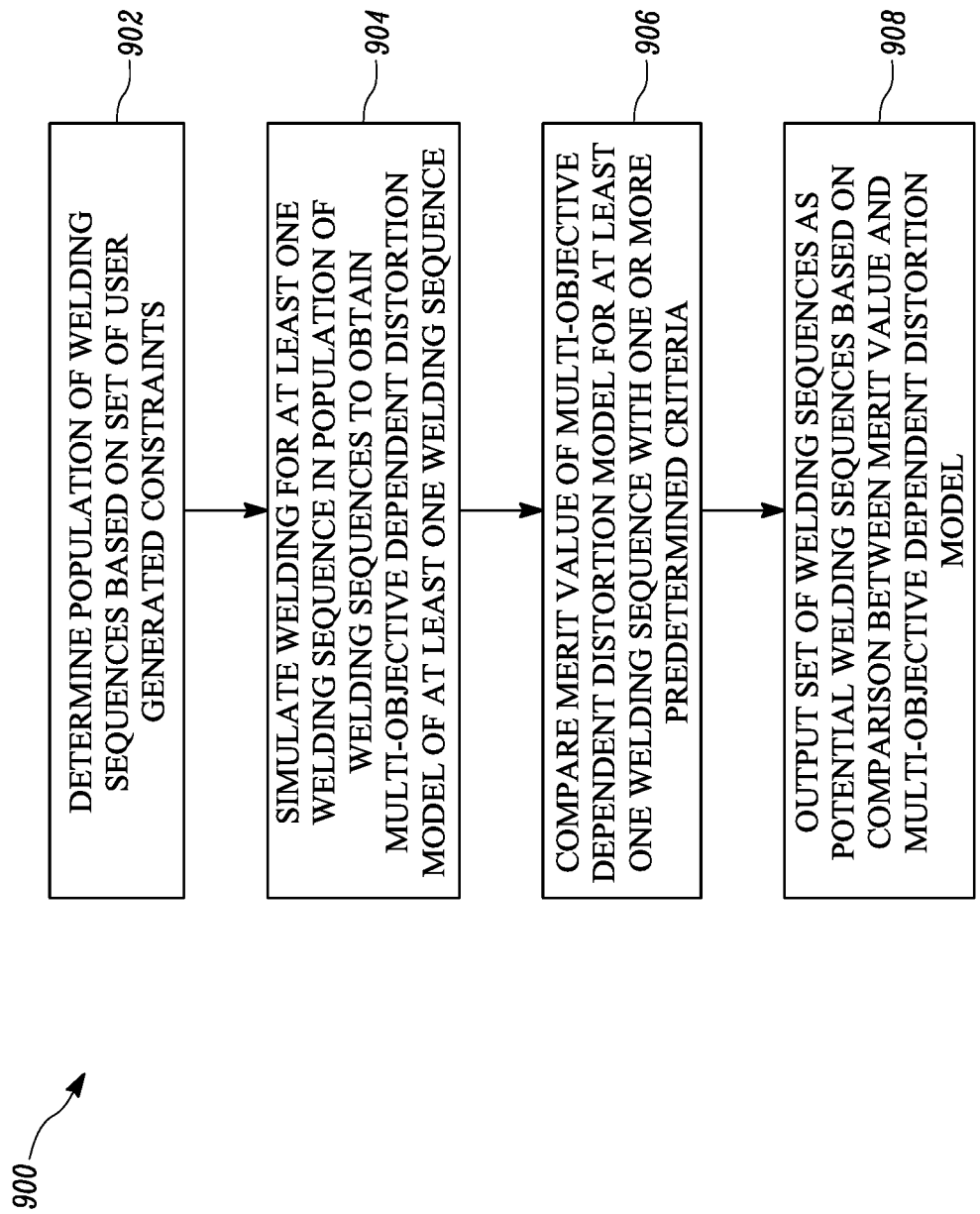
FIG. 9 is a method flow chart of graph showing a computer implemented method for determining a welding sequence.

Referring now to FIG. 9, which illustrates a computer-implemented method 900 for determining a welding sequence including a plurality of welding operations. The method 900 includes, at 902, determining a population of welding sequences based on a set of user-generated constraints. The method 900 further includes, at 904, simulating welding for at least one welding sequence in the population of welding sequences to obtain a multi-objective dependent distortion model of the at least one welding sequence. Subsequently, the method 900, at 906, includes comparing a merit value of the multi-objective dependent distortion model for the at least one welding sequence with one or more predetermined criteria. The method 900 further includes, at 908, outputting a set of welding sequences as potential welding sequences based on the comparison between the merit value and the multi-objective dependent distortion model.

The system 100 and method 800 of the present disclosure may be applied for determining the set of welding sequences as the potential welding sequences, and presenting the same to the user. In order to determine the potential welding sequences, the system 100 and the method 800 of the present disclosure take into account other parameters in addition to different weld sequences. Therefore, the present system 100 and the method 800 do not rely only on the plurality of weld sequences to determine the optimum welding sequence. The system 100 and the method 800 of the present disclosure use many design variables from the multi objective algorithm to determine a plurality of potential welding sequences. The system 100 and method 800 of the present disclosure also provide flexibility to the user in selecting any particular welding sequence from the plurality of welding sequences as a final welding sequence. The user may have an option of doing a trade-off between the distortions with overall cycle time.

It will be apparent to those skilled in the art that various modifications and variations can be made to the disclosed welding sequence determination system. Other embodiments will be apparent to those skilled in the art from consideration of the specification and practice of the disclosed welding sequence determination system. It is intended that the specification and examples be considered as exemplary only, with a true scope being indicated by the following claims and their equivalents.

What is claimed is:

1. A computer-implemented method for selecting a welding sequence for welding, the method comprising:
   determining a population of welding sequences based on a set of user-generated constraints;
   simulating welding for at least one welding sequence in the population of welding sequences to obtain a multi-objective dependent distortion model of the at least one welding sequence,
      the multi-objective dependent distortion model being based on multiple objective functions, and
      the multiple objective functions including a first objective function that is based on determining a value of distortion due to a direction of weld in the at least one welding sequence and a second objective function that is based on determining a value of a cooling time between welds of the at least one welding sequence;
   comparing the value of sequence the distortion and the value of the cooling time with one or more predetermined criteria; and outputting a set of welding sequences as potential welding sequences based on comparing the value of the distortion and the value of the cooling time with the one or more predetermined criteria,
the welding sequence being selected from the potential welding sequences, and
a component being welded based on the welding sequence.

2. The computer-implemented method of claim 1, further comprising:
determining a cycle time pertaining to each of the potential welding sequences.

3. The computer-implemented method of claim 2, further comprising:
selecting the welding sequence, from the potential welding sequences, based on the cycle time pertaining to each of the potential welding sequences.

4. The computer-implemented method of claim 1, wherein the set of user-generated constraints includes an input regarding weld sequences, an input regarding cooling levels between weld operations, an input regarding a direction of welding in welding operations, and an input regarding a number of weld processes per weld sequence.

5. The computer-implemented method of claim 1, wherein the multi-objective dependent distortion model comprises a simulation of welding for the at least one welding sequence to obtain a cooling time dependent distortion model for the at least one welding sequence.

6. The computer-implemented method of claim 1, wherein the multi-objective dependent distortion model comprises a simulation of welding for the at least one welding sequence to obtain a weld direction dependent distortion model for the at least one welding sequence.

7. The computer-implemented method of claim 1, further comprising:
determining that the one or more predetermined criteria are not satisfied;
creating a subsequent population of welding sequences based on determining that the one or more predetermined criteria are not satisfied; and
simulating welding for the at least one welding sequence in the subsequent population,
wherein the at least one welding sequence in the subsequent population has a distortion less than or equal to a distortion in each of the population of welding sequences.

8. A system for selecting a welding sequence for welding, the system comprising:
a memory; and
one or more processors to:
determine a population of welding sequences based on a set of user-generated constraints;
simulate welding for at least one welding sequence in the population of welding sequences to obtain a multi-objective dependent distortion model of the at least one welding sequence,
the multi-objective dependent distortion model being based on multiple objective functions, and
the multiple objective functions including a first objective function that is based on determining a value of distortion due to a direction of weld in the at least one welding sequence and a second objective function that is based on determining a value of a cooling time between welds of the at least one welding sequence;
compare the value of the distortion and the value of the cooling time with one or more predetermined criteria; and
output a set of welding sequences as potential welding sequences based on comparing the value of the distortion and the value of the cooling time with the one or more predetermined criteria,
the welding sequence being selected from the potential welding sequences, and
a component being welded based on the welding sequence.

9. The system of claim 8, wherein the one or more processors are further to:
determine a cycle time pertaining to each of the potential welding sequences.

10. The system of claim 9, wherein the one or more processors are further to:
select the welding sequence, from the potential welding sequences, based on the cycle time pertaining to each of the potential welding sequences.

11. The system of claim 8, wherein the set of user-generated constraints include an input regarding weld sequences, an input regarding cooling levels between weld operations, an input regarding a direction of welding in weld operations, and an input regarding a number of weld processes per weld sequence.

12. The system of claim 8, wherein the multi-objective dependent distortion model comprises a simulation of welding for the at least one welding sequence in the population of welding sequences to obtain a cooling time dependent distortion model for the at least one welding sequence.

13. The system of claim 8, wherein the multi-objective dependent distortion model comprises a simulation of welding for the at least one welding sequence in the population of welding sequences to obtain a weld direction dependent distortion model for the at least one welding sequence.

14. The system of claim 8,
wherein the one or more processors are further to:
create a subsequent population of welding sequences; and
simulate welding for the at least one welding sequence in the subsequent population, and
wherein the at least one welding sequence in the subsequent population has a distortion less than or equal to a distortion in each of the population of welding sequences.

15. A non-transitory computer-readable medium storing instructions for selecting a welding sequence for welding, the instructions comprising:
one or more instructions that, when executed by one or more computer processors, cause the one or more computer processors to:
determine a population of welding sequences based on a set of user-generated constraints;
simulate welding for at least one welding sequence in the population of welding sequences to obtain a multi-objective dependent distortion model of the at least one welding sequence,
the multi-objective dependent distortion model being based on multiple objective functions, and
the multiple objective functions including a first objective function that is based on determining a value of distortion due to a direction of weld in the at least one welding sequence and a second objective function that is based on determining a value of a cooling time between welds of the at least one welding sequence;

compare the value of the distortion and the value of the cooling time with one or more predetermined criteria; and output a set of welding sequences as potential welding sequences based on comparing the value of the distortion and the value of the cooling time with the one or more predetermined criteria, the welding sequence being selected from the potential welding sequences, and a component being welded based on the welding sequence.

16. The non-transitory computer-readable medium according to claim 15, wherein the one or more instructions further cause the one or more computer processors to:

determine a cycle time pertaining to each of the potential welding sequences; and select the welding sequence, from the potential welding sequences, based on the cycle time pertaining to each of the potential welding sequences.

17. The non-transitory computer-readable medium according to claim 15, wherein the multiple objective functions take into account effects of different types of distortions.

18. The non-transitory computer-readable medium according to claim 15, wherein the multiple objective functions comprise:

a first variable related to mechanical distortion, and a second variable related to an effect that is different from the mechanical distortion.

19. The non-transitory computer-readable medium according to claim 15, wherein the one or more predetermined criteria comprise:

a first threshold for a first type of distortion, a second threshold for a second type of distortion, and a third threshold for the cooling time between the welds.

20. The non-transitory computer-readable medium according to claim 19, wherein the first type of distortion is related to the direction of weld.

* * * * *